(12) United States Patent
Bemmerl et al.

(10) Patent No.: US 7,064,429 B2
(45) Date of Patent: Jun. 20, 2006

(54) ELECTRONIC PACKAGE HAVING INTEGRATED COOLING ELEMENT WITH CLEARANCE FOR ENGAGING PACKAGE

(75) Inventors: Thomas Bemmerl, Schwandorf (DE); Holger Wörner, Regensburg (DE); Bernd Waidhas, Sinzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/177,947

(22) Filed: Jun. 20, 2002

(65) Prior Publication Data
US 2002/0195701 A1 Dec. 26, 2002

(30) Foreign Application Priority Data
Jun. 20, 2001 (DE) .................. 101 29 388

(51) Int. Cl.
*H01L 21/00* (2006.01)
(52) U.S. Cl. ............... 257/713; 257/712; 257/706
(58) Field of Classification Search ............ 257/706, 257/712–722
See application file for complete search history.

(56) References Cited

U.S. PATENT DOCUMENTS

| | | | |
|---|---|---|---|
| 5,566,181 A | 10/1996 | Huang et al. | |
| 5,699,353 A | 12/1997 | Kent | |
| 5,705,851 A | 1/1998 | Mostafazadeh et al. | 257/675 |
| 5,773,723 A * | 6/1998 | Lewis et al. | 73/861.12 |
| 5,796,160 A * | 8/1998 | Kozono | 257/675 |
| 5,850,611 A | 12/1998 | Krebs | |
| 5,883,430 A | 3/1999 | Johnson | 257/706 |
| 5,905,633 A | 5/1999 | Shim et al. | 361/704 |
| 6,093,961 A * | 7/2000 | McCullough | 257/718 |
| 6,146,921 A | 11/2000 | Barrow | 438/122 |
| 6,151,501 A | 11/2000 | Belkin et al. | |
| 6,246,115 B1* | 6/2001 | Tang et al. | 257/706 |
| 6,541,310 B1* | 4/2003 | Lo et al. | 438/122 |
| 6,559,536 B1* | 5/2003 | Katoh et al. | 257/712 |
| 6,775,140 B1* | 8/2004 | Shim et al. | 361/704 |
| 2002/0195701 A1* | 12/2002 | Bemmerl et al. | 257/706 |
| 2005/0046012 A1* | 3/2005 | Ramakrishna et al. | 257/706 |

FOREIGN PATENT DOCUMENTS

| | | | |
|---|---|---|---|
| EP | 469970 A | * | 2/1992 |
| JP | 09 008 186 A | | 1/1997 |
| WO | WO 01/15225 A1 | | 3/2001 |

OTHER PUBLICATIONS

Handbook of Electronic Package Design, Michael Pecht ed., Marcel Dekker, Inc.: New York, 1991, pp. 76-97.*
Handbook of Electronic Package Design, Michael Pecht ed., Marcel Dekker, Inc.: New York, 1991, pp. 213-216.*

* cited by examiner

*Primary Examiner*—Laura M. Schillinger
(74) *Attorney, Agent, or Firm*—Laurence A. Greenberg; Werner H. Stemer; Ralph E. Locher

(57) ABSTRACT

An electronic component includes at least one semiconductor chip. The semiconductor chip is attached on a first side of a wiring board or a leadframe. The wiring board is provided with interconnect structures at least on a second side. The first side of the wiring board, with the semiconductor chip located on it, is completely enclosed by a package. The package is provided with a cooling element, which is an integral part of the package. The invention also relates to a method for producing the electronic component.

24 Claims, 3 Drawing Sheets

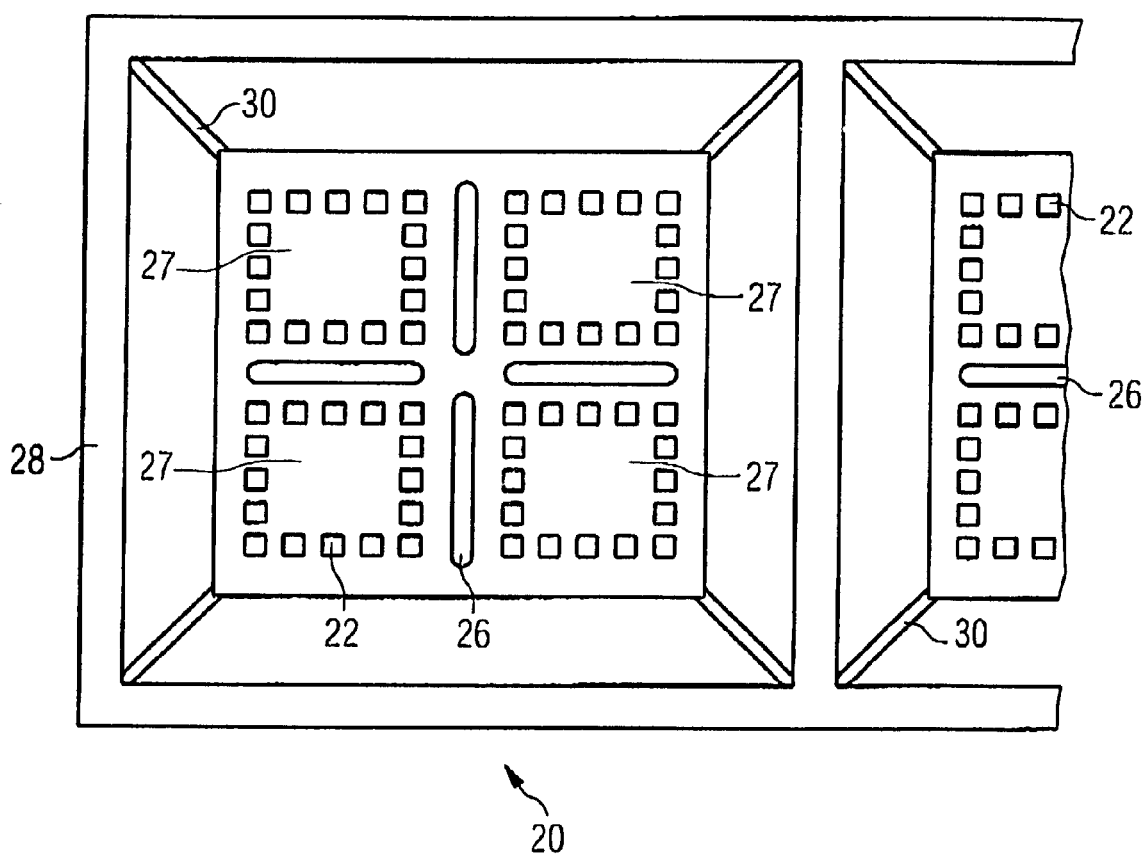

ELECTRONIC PACKAGE HAVING INTEGRATED COOLING ELEMENT WITH CLEARANCE FOR ENGAGING PACKAGE

BACKGROUND OF THE INVENTION

Field of the Invention

The invention relates to an electronic component and a method for producing the electronic component.

Considerable power losses during operation and the associated development of heat in some electronic components with semiconductor chips often require them to include cooling devices. The cooling devices are generally passive heat sinks that are connected to the electronic components during or after their production. In standard packages with supporting elements on the wiring board or the leadframe (BGAs, Ball Grid Arrays), restricted space prevents the mounting or fitting of a cooling element in particularly compact packages. Examples of such compact packages are those termed Fine Pitch BGAs. The heat dissipation in such compact packages can occur, for example, by adapting the thermal ambient conditions, i.e. by a suitable construction of the printed circuit board. Heat dissipation can occur in specially constructed carrier substrates: for example, carrier substrates having an increased number of thermal apertures under the semiconductor chip. Finally, enlarging can prevent thermal problems.

SUMMARY OF THE INVENTION

It is accordingly an object of the invention to provide an electronic component and a method for producing the electronic component that overcomes the hereinafore-mentioned disadvantages of the heretofore-known devices of this general type and that avoids the disadvantages of the prior art and provide an electronic device with at least one semiconductor chip, the device having a very compact package and adequate cooling.

With the foregoing and other objects in view, there is provided, in accordance with the invention, an electronic component. The electronic component includes a semiconductor chip, a wiring board, a package, and a cooling element. The semiconductor chip has an active front side with semiconductor structures and a passive rear side without semiconductor structures. The wiring board has a first side attached to the semiconductor chip and has interconnect structures at least on a second side facing away from the semiconductor chip. The package completely encloses the first side of the wiring board. The cooling element is integrated into the package.

In other words, an electronic component has at least one semiconductor chip with an active front side with semiconductor structures and a passive rear side without semiconductor structures. The active front side or the passive rear side attaches onto a first side of a wiring board or a leadframe. The wiring board or leadframe includes interconnect structures at least on a second side, opposing the semiconductor chip. Moreover, a package encloses the first side of the wiring board, with the semiconductor chip located on it. According to the invention, the package includes a cooling element, which is an integral part of the package.

Integrally connecting the cooling element to the package allows the electronic component to be shrunk because power loss occurring during operation can be effectively dissipated. Not fitting the cooling element on the wiring board frees additional surface area for establishing bonding connections. A further advantage is the consequently obtained flexibility in the construction of the electronic component. If, for example, it is found during the development process of the semiconductor chip that the power losses arising during operation are less than originally calculated, it is readily possible simply to dispense with the cooling element and produce the component package without such a cooling element. This means that the construction of the carrier substrate or wiring board or leadframe does not have to be changed.

It is also advantageous that already existing processing processes scarcely have to be changed because the invention can be used with minimal modifications on many existing package assembly lines. With the aid of the cooling elements, the electronic components can consequently be produced with smaller packages of a thermal resistance that could otherwise only be achieved with larger packages.

In one embodiment of the invention, the cooling element is formed as a metal plate. The high thermal conductivity of the metal increases heat dissipation. If appropriate, the metal plate may be provided with further passive or active cooling devices that could be connected to the cooling element with heat conducting paste. A further advantage of the cooling device including a metal plate is its shielding property. The shielding property protects the cooling element from disturbing electromagnetic influences.

A further embodiment provides that the cooling element covers at least the entire upper surface area of the package. In this embodiment, the cooling element has particularly good shielding properties. Moreover, the embodiment optimizes dissipation of power loss in the form of heat.

In the case of one embodiment according to the invention, the cooling element has clearances, in which the package engages. This ensures a firm and unreleasable connection between the cooling element and the package. Moreover, this connection provides a good heat transfer contact between the package and the cooling element.

In accordance with a further embodiment, the clearances have a funnel-shaped cross-section, with the funnel becoming wider toward the top. The clearances preferably have an angular or round contour. Such a formation makes close and unreleasable interlocking possible between the package and the cooling element, which moreover can be produced relatively easily and consequently at low cost.

In an embodiment of the invention, the clearances have a diameter ranging from three to fifteen percent (3–15%) of a side length of the cooling element. Such a clearance creates a good ratio between the optimum mechanical connection and the most effective possible heat dissipation. With clearances that are too small, there would be the risk of a connection between the package and the cooling element that is too weak. With clearances that are too large, the heat-dissipating capability is reduced from the lower effective cooling area.

One embodiment of the invention provides that the clearances are etched. This allows even the smallest clearances to be produced in almost any desired contour in a very exact way. Etching also has the advantage that even large batches of cooling elements that are later divided can be provided with clearances in one operation.

An alternative embodiment of the invention provides that the clearances are made by laser drilling or by punching, whereby very exact and dimensionally accurate clearances can be produced. Laser drilling is particularly suitable for smaller batches, whereas punching is also suitable for very large numbers of units at very high throughput rates.

In the case of one embodiment according to the invention, the clearances create a form-locking connection to the package in the form of a dovetail connection, which provides a very stable connection between the cooling element and the package. A form-locking connection is one that connects two elements together due to the shape of the elements themselves, as opposed to a force-locking connection, which locks the elements together by force external to the elements.

According to one embodiment of the invention, the package is formed from a plastic. The insulating properties of plastics are particularly well suited for enclosing the semiconductor chip. Moreover, plastics can be processed very easily by the injection-molding process. The cooling element can be encapsulated with the plastic in one operation without significant problems.

In an embodiment of the invention, the cooling element has a matrix structure. Each semiconductor chip is covered by one surface-area portion. Separating joints subdivide neighboring surface-area portions. In this way, a common cooling element can be used to cover even relatively large surface areas of a number of electronic components, which, if appropriate, are then subsequently separated individually. In this case, the sawing track regions for dividing the subassemblies run along the separating joints of the cooling element. This matrix structure permits particularly efficient and low-cost production.

With the objects of the invention in view, there is also provided a method for producing an electronic component. The first step of the method is providing a wiring board. The next step is applying semiconductor chips to the wiring board. The next step is bonding the semiconductor chips to the wiring board. The next step is applying a package to the semiconductor chip and the wiring board. The next step is integrally connecting a cooling element to the package.

In other words, the method according to the invention for producing an electronic component according to one of the embodiments described above can have at least the following method steps. Semiconductor chips are applied to a wiring board or a leadframe and connected to the latter and soldering or bonding connections are subsequently established between the semiconductor chips and the wiring board. After that, a package and a cooling element connected to it are applied to the semiconductor chip and the wiring board, the cooling element being integrally connected to the package.

This method according to the invention for producing the electronic component makes it possible to provide an integrated cooling element in a particular simple and low-cost way, allowing particularly compact forms of the package to be realized.

One embodiment of the method according to the invention provides that a number of semiconductor chips are applied to a wiring board. In this way, relatively large components can be provided in one operation with a cooling element, which in this case expediently has a matrix structure.

In the case of one embodiment according to the invention, the wiring board is separated into individual electronic components after the package and the cooling elements have been applied. This makes it possible for relatively large matrix units to be initially produced and then subsequently separated individually into smaller electronic components.

According to one embodiment of the invention, the package is produced from plastic by transfer molding. The cooling element is attached to an upper mold part or a lower mold part of a mold and separated from the latter after the molding process. The method makes allows an integrated package with a cooling element to be produced easily and quickly. The cooling element is in this case placed into the mold and can, if appropriate, rest loosely in the upper or lower part of the package. An advantageous variant may be that of keeping the cooling element in its place by vacuum suction devices. These include suction lines in the upper or lower part of the package, against which the cooling element lies with an intermediate film layer, which serves for sealing.

One embodiment of the method according to the invention provides that sawing track regions on the wiring board are disposed congruently with separating joints in the cooling element. In this way, during the individual separation it is not necessary to cut through the cooling element but only through narrow webs.

A further alternative embodiment of the method according to the invention provides that the cooling element has a frame, which is connected to cooling areas by thin webs, is placed in the mold and is clamped between the upper mold part and lower mold part. Thereby, further fixings of the cooling element in the mold can be dispensed. Examples of further fixings include self-adhesive films, attachment by vacuum suction, or the like. The surrounding frame can either remain on the electronic component and be used for further mechanical handling, or else it may be advantageous to cut off the frame together with its thin webs from the cooling element after removal from the mold, in order to keep the package as compact as possible.

Other features which are considered as characteristic for the invention are set forth in the appended claims.

Although the invention is illustrated and described herein as embodied in an electronic component and a method for producing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 is a plan view showing the cooling element according to FIG. 6.

DESCRIPTION OF THE PREFERRED EMBODIMENTS

Figure 1:
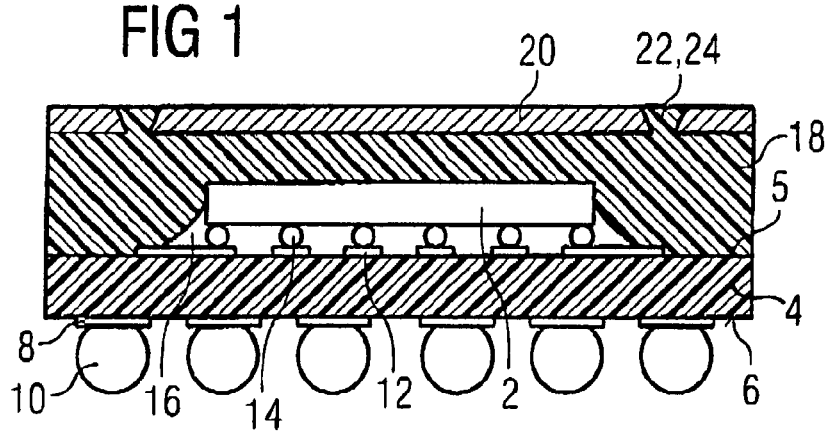
FIG. 1 is a diagrammatic sectional view showing an electronic component with a cooling element according to the invention.

Referring now to the figures of the drawings in detail and first, particularly to FIG. 1 thereof, there is shown an electronic component according to the invention, which is provided with a cooling element 20. A wiring board 4, which is provided on its first side (upper side) 5 with a multiplicity of contact terminal areas 12, can be seen. Soldering connections 14 mount a semiconductor chip 2 on the contact terminal areas 12. If appropriate, the semiconductor chip 2 also may be connected to the wiring board 4 by bonding connections not shown here. The contact terminal areas 12 on the first side 5 of the wiring board 4 are respectively connected to contact areas 8 on a second side 6 (underside), on which a contact bump, for example in the form of a solder ball or the like, is located in each case. These solder balls are suitable for making possible what is known as flip-chip mounting of the electronic component.

The soldering connections 14 between the electrical terminals of the active side of the semiconductor chip 2 and the contact terminal areas 12 of the wiring board 4 are enclosed by an insulating layer 16, which may for example include a layer of insulating plastic. The first side 5 of the wiring board 4 and the entire semiconductor chip 2 are surrounded by a package 18, which preferably includes a plastic. The plastic is applied by an injection-molding process (known as transfer molding). The package 18 covers the semiconductor chip 2 and is in turn covered on its upper surface area by a cooling element 20 in the form of a metal plate. The cooling element 20 forms a form-locking connection with the package 18 by engaging pins 24 in clearances 22, and is consequently an integral part of the package 18.

Figure 2:
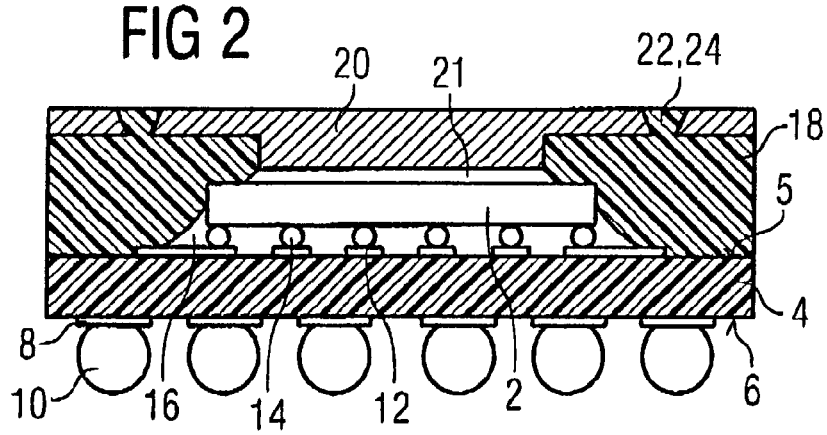
FIG. 2 is a sectional view showing a variant of the electronic component according FIG. 1.

As can be seen from FIGS. 1 and 2, the clearances 22 are formed in the represented cross section in a funnel-shaped manner, the funnel becoming wider toward the top, i.e. away from the package. The pins 24, which are formed during the injection-molding process of the package 18, engage in the clearances 22 and form with the latter in each case a kind of dovetail connection. The cooling element 20 consequently rests flat on the package 18. As a result, the cooling element 20 dissipates the heat produced by power losses during the operation of the semiconductor chip 2 of the electronic component.

FIG. 2 shows in a schematic cross-sectional representation a variant of the electronic component according to FIG. 1. The same parts as in FIG. 1 are provided with the same reference numerals and are not explained again. In this embodiment, the cooling element 20 is made somewhat thicker in the central portion of its surface area, so that it reaches almost as far as the semiconductor chip 2 and is not separated from the latter by the upper surface area of the package 18 of plastic. Rather, between the cooling element 20 and the passive rear side of the semiconductor chip 2 there is a connecting layer 21, which provides an adhesive bond and best possible heat transfer between the semiconductor chip 2 and the cooling element 20. The remaining details of this embodiment that can be seen correspond to the representation according to FIG. 1.

Figure 3:
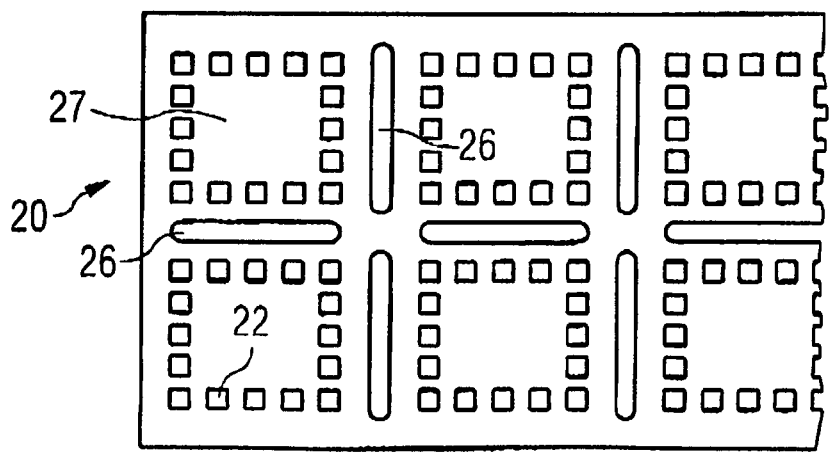
FIG. 3 is a plan view of a cooling element in matrix form.

FIG. 3 shows in a schematic plan view a cooling element 20 by way of example, which has a number of surface-area portions 27, which are in each case separated by separating joints 26 in the form of elongate apertures. In the exemplary embodiment shown, two surface-area portions 27 are in each case disposed in pairs next to one another and are separated by separating joints 26. Any number of pairs of surface-area portions 27 may be disposed next to one another in the length. Each surface-area portion 27 is provided for forming a cooling element 20 for a semiconductor chip 2. The cooling element 20 constructed in the form of a matrix can be individually separated after mounting on the semiconductor chip 2 together with the wiring board 4. The separating joints 26 in this case expediently lie congruently over the sawing track regions of the carrier substrate. It is similarly possible, however, to mount a matrix of cooling elements 20 on a number of semiconductor chips 2, which form a common electronic component.

The clearances 22 are disposed in each case in the form of a four-cornered ring on a surface-area portion 27, with five clearances 22 respectively lying on each side of a surface-area portion 27. In the exemplary embodiment represented, the clearances 22 are made square in each case. However, round or oval contours or contours of some other shape are also similarly possible. The clearances 22 expediently have a diameter that corresponds approximately to three to fifteen percent (3%–15%) of a side length of a surface-area portion 27. In this way, they are large enough to provide, with the pins 24 engaging in them, a secure connection to the package 18. On the other hand, they are small enough to leave sufficient cooling area of the cooling element 20 and not to impair the heat-dissipating properties of the latter.

The clearances 22 may be etched, punched, formed by laser drilling, or formed in some other suitable way. Etching has the advantage that very exact holes with precisely the desired funnel angles can be formed even in the case of relatively large batches.

Figure 4:
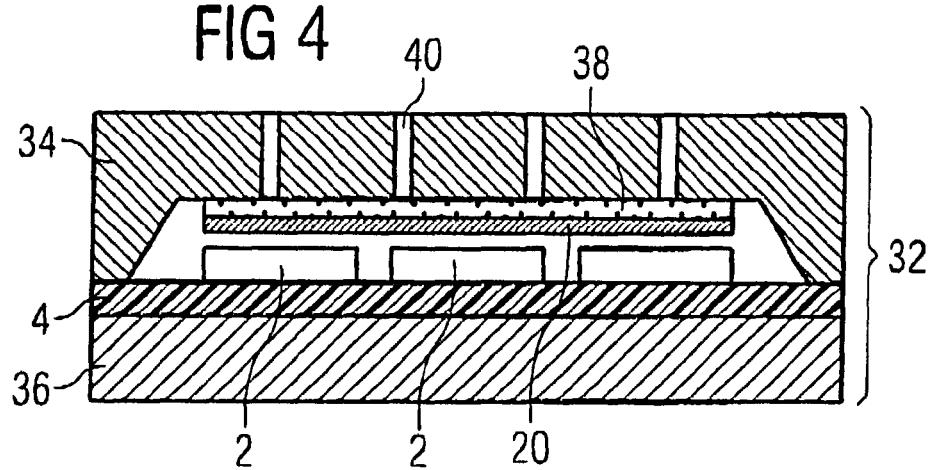
FIG. 4 is a sectional view showing a mold with placed-in components for producing an electronic component.
Figure 5:
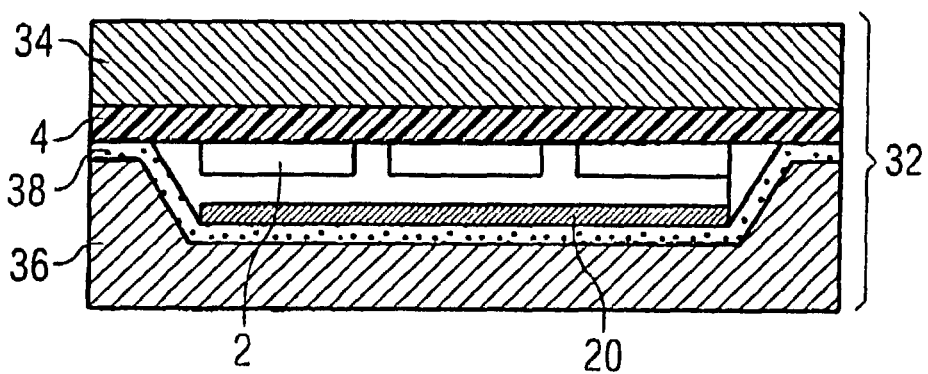
FIG. 5 is a sectional view showing an alternative variant of the mold according to FIG. 4.
Figure 6:
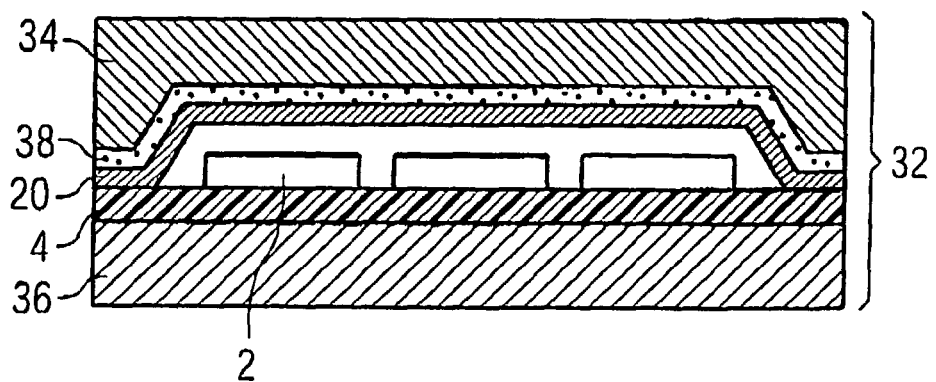
FIG. 6 is a sectional view showing a further alternative variant of the mold according to FIGS. 4 and 5.

FIGS. 4 to 6 respectively show in schematic cross-sectional representations a mold 32 with placed-in components for producing an electronic component according to the invention. In this case, a wiring board 4 with semiconductor chips 2 mounted on it is respectively placed on the lower mold part 36 (FIGS. 4 and 6) or on the upper mold part 34 (FIG. 5) of a mold 32 and is firmly clamped between the upper mold part 34 and lower mold part 36.

In the exemplary embodiment according to FIG. 4, an adhesive film 38 is attached to the upper mold part 34, formed in a hollow-shaped manner, and the cooling element 20 is attached on the film. The thin adhesive film 38 is preferably formed as a single-sided adhesive film. The adhesive film 38 can be easily removed again from the upper side of the cooling element 20 after the injection-molding process. In the upper mold part 34, there can be seen a number of apertures 40. The apertures 40 are provided for the attachment by vacuum suction of the optionally single-sided adhesive film 38. In this way, the film 38 with the cooling element 20 adhesively bonded to it can be reliably held at its intended position while the liquid plastic is injected into the mold 32. After removal from the mold, an electronic component with a cooling element 20 integrally connected to the package 18 is obtained.

FIG. 5 shows an alternative variant of the mold 32, in which not only the wiring board 4 but also the film 38 is clamped between the lower mold part 36 and upper mold part 34. The film 38 in this case covers the entire curvature of the lower mold part 36 formed in a hollow-shaped manner. In this embodiment, the upper mold part 34 is formed in a planar manner. The cooling element 20 is applied to the planar surface-area portion of the lower mold part 36 and held by the film 38.

FIG. 6 is a further embodiment of the mold 32 with the wiring board 4 placed in it and semiconductor chips 2 mounted on the wiring board. In this case, the wiring board 4, the film 38, and the cooling element 20 are clamped between the upper mold part 34 and lower mold part 36 of the mold 32. As in the embodiment according to FIG. 4, it is also the case in this embodiment according to FIG. 6 that the lower mold part 36 with the wiring board 4 resting on it is made planar and the lower mold part with the film 38 adhesively bonded to it is made curved.

As can best be seen from the plan view of FIG. 7, an alternative embodiment of the cooling element 20 has a peripheral edge 28 that is connected to the surface-area portions 27 via a number of webs 30. In the exemplary embodiment shown, four surface-area portions 27 are respectively grouped together as a square and respectively separated from one another by separating joints 26. Respectively provided at each corner of this matrix of four, there is a web 30. The web leads to the frame 28 at an angle of about forty-five degrees (45°) in relation to the side edge of the matrix. The frame 28 is respectively kept at a constant distance from the matrix of four of the surface-area portions 27.

The edge 28 serves for the clamping between the upper mold part 34 and lower mold part 36, as can be seen in FIG. 7. The webs 30 represent the connection to the actual cooling element 20 and are partly encapsulated by the plastic. As can be seen from FIG. 6, the webs 30 follow the curved contour of the upper mold part 34, so that the cooling element 20 according to FIG. 7 has altogether a roof-like contour. The frame 28 in this case forms the base area; the webs 30 lead obliquely upward, so that the surface-area portions 27 attached to them form an elevated surface area with respect to the frame 28. For example, this contour may be formed by punching and thermoforming.

In the embodiment of FIG. 7, the matrix of four of the surface-area portions 27 is adjoined by a further matrix of four, which is attached to the common frame 28. This relatively large cooling element 20 can either be connected to a package 18 of an electronic component in a single processing step or be separated in advance into individual parts. However, the separation may also take place after the encapsulation of relatively large subassemblies of electronic components, which are subsequently and individually separated. In this case, the separating joints 26 expediently come to lie over sawing track regions between neighboring electronic components.

We claim:

1. An electronic component, comprising:
   a semiconductor chip having an active front side and a passive rear side without semiconductor structures;
   a wiring board having a first side connected by soldering connections to said active front side of said semiconductor chip and having interconnect structures at least on a second side facing away from said semiconductor chip;
   a package completely enclosing said first side of said wiring board;
   a cooling element having a central area and clearances with a straight-sided V-shaped funnel cross section widening in an upward direction formed therein and being integrated in said package, said central area thickening and reaching toward said semiconductor chip, said package being form-lockingly engaged by a dovetail connection in said clearances; and
   a connecting layer connecting said central area of said cooling element and said passive rear side of said semiconductor chip so that said central area of said cooling element is not separated from said semiconductor chip by material of said package.

2. The electronic component according to claim 1, wherein said wiring board is a leadframe.

3. An electronic component, comprising:
   a semiconductor chip having an active front side and a passive rear side without semiconductor structures;
   a wiring board having a first side connected by soldering connections to said passive rear side of said semiconductor chip and having interconnect structures at least on a second side facing away from said semiconductor chip;
   a package completely enclosing said first side of said wiring board;
   a cooling element having a central area and clearances with a straight-sided v-shaped funnel cross section widening in an upward direction formed therein and being integrated in said package, said central area thickening and reaching toward said semiconductor chip, said package being form-lockingly engaged by a dovetail connection in said clearances; and
   a connecting layer connecting said central area of said cooling element and said active front side of said semiconductor chip so that said central area of said cooling element is not separated from said semiconductor chip by material of said package.

4. The electronic component according to claim 1, wherein said cooling element is a metal plate.

5. The electronic component according to claim 1, wherein said clearances have a round contour.

6. The electronic component according to claim 1, wherein:
   said cooling element has a side length; and said clearances have a diameter sized from 3 to 15% of said side length of the cooling element.

7. The electronic component according to claim 1, wherein said clearances are formed by etching.

8. The electronic component according to claim 1, wherein said clearances are formed by laser drilling.

9. The electronic component according to claim 1, wherein said clearances are formed by punching.

10. The electronic component according to claim 1, wherein said package is a plastic package.

11. The electronic component according claim 1, wherein said package is an injection-molded plastic package.

12. The electronic component according to claim 1, including a further semiconductor chip;
   said cooling element having a matrix structure with a plurality of surface-area portions each covering a respective semiconductor chip and separating joints subdividing neighboring surface-area portions.

13. A method for producing an electronic component, which comprises;
   providing a semiconductor chip having an active front side and a passive rear side without semiconductor structures;
   providing a wiring board having a first side and a second side facing away from the semiconductor chip, the second side having interconnect structures formed thereon;
   mounting the semiconductor chip to the wiring board by connecting the first side of the wiring board to the active front side of the semiconductor chip by soldering connections;
   applying a package to the semiconductor chip and the wiring board to completely enclose the first side of the wiring board;
   integrating a cooling element to the package, the cooling element having a central area and clearances with a straight-sided V-shaped funnel cross section widening in an upward direction formed therein, the central area thickening and reaching toward the semiconductor chip, the package being form-lockingly engaged by a dovetail connection in the clearances; and
   providing a connecting layer connecting the central area of the cooling element and the passive rear side of the semiconductor chip so that the central area of the cooling element is not separated from the semiconductor chip by material of the package.

14. The method according to claim 13, which further comprises using a leadframe as the wiring board.

15. The method according to claim 13, which further comprises applying a plurality of semiconductor chips to the wiring board.

16. The method according to claim 15, which further comprises separating the wiring board into individual electronic components after applying the package and the cooling element.

17. The method according to claim 13, which further comprises producing the package from plastic by transfer molding.

18. The method according to claim 17, which further comprises:
    attaching the cooling element to one part of a mold having an upper mold part and a lower mold part; and separating the cooling element from the mold after the transfer molding step.

19. The method according to claim 18, which further comprises sealing the cooling element from the mold with a film.

20. The method according to claim 13, which further comprises:
    providing sawing track regions on the wiring board;
    providing separating joints in the cooling element; and
    disposing congruently the track regions on the separating joints.

21. The method according to claim 18, which further comprises:
    providing the cooling element with cooling areas and a frame surrounding the frame;
    connecting the frame to the cooling areas by thin webs;
    clamping the cooling element in the mold between the upper mold part and lower mold part.

22. The method according to claim 21, which further comprises:
    removing the cooling element from the mold after molding; and severing the thin webs and the frame after the removing from the mold.

23. The electronic component according to claim 1, wherein said connecting layer directly connects said cooling element and said passive rear side of said semiconductor chip.

24. An electronic component, comprising:
    a semiconductor chip having an active front side and a passive rear side without semiconductor structures;
    a wiring board having a first side connected by soldering connections to said active front side of said semiconductor chip and having interconnect structures at least on a second side facing away from said semiconductor chip;
    a plastic package completely enclosing said first side of said wiring board;
    a cooling element having a central area and clearances with a funnel-shaped cross section widening in an upward direction formed therein and being integrated in said package, said central area thickening and reaching toward said semiconductor chip, said package being form-lockingly engaged by a dovetail connection in said clearances; and
    a connecting layer connecting said central area of said cooling element and said passive rear side of said semiconductor chip so that said central area of said cooling element is not separated from said semiconductor chip by plastic material of said plastic package.

* * * * *